US006723578B2

(12) United States Patent
Lorans et al.

(10) Patent No.: US 6,723,578 B2
(45) Date of Patent: Apr. 20, 2004

(54) METHOD FOR THE SULPHIDATION TREATMENT OF III-V COMPOUND SEMICONDUCTOR SURFACES

(75) Inventors: Dominique Lorans, Paris (FR); Bruno Canava, Paris Cedex (FR); Arnaud Etcheberry, Paris Cedex (FR); Michel Herlem, Paris Cedex (FR); Jacky Vigneron, Paris Cedex (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 10/157,039

(22) Filed: May 30, 2002

(65) Prior Publication Data

US 2002/0182840 A1 Dec. 5, 2002

(30) Foreign Application Priority Data

May 31, 2001 (FR) .............................. 01 07166

(51) Int. Cl.$^7$ .............................................. H01L 21/00
(52) U.S. Cl. ............................................... 438/38
(58) Field of Search ............................ 438/38, 92, 93, 438/572, 370, 372

(56) References Cited

U.S. PATENT DOCUMENTS

| 4,751,201 | A | 6/1988 | Nottenburg et al. |
| 5,036,376 | A | 7/1991 | Teherani et al. |
| 6,197,667 | B1 * | 3/2001 | Chang et al. ............... 438/570 |

OTHER PUBLICATIONS

Nannichi et al (Japanese Journal of Applied Physics, vol. 27, No. 12, Dec., 1988, pp. L2367–L2369).*
Perotin et al., "Improvement of dark current of Ga(Al)Sb mesa diodes using (NH4)2S treatment", Materials Science and Engineering B28 (1994) pp. 374–378.
Jeng et al., "Surface Passivation Using P2S5/(NH4)2Sx and Hydrogen Fluoride Solutions . . . " Jpn. J. Appl. Phys. vol. 40 (2001), pp. 562–564.
Driad et al., "Passivation of InP–based HBTs", Solid–State Electronics 43 (1999), pp. 1445–1450.
Nannichi et al., "A Model to Explain the Effective Passivation of the GaAs Surface by (NH4)2Sx Treatment", Japanese Journal Of Applied Physics, vol. 27, No. 12, Dec. 1988, pp. L2367–2369.

* cited by examiner

Primary Examiner—David Nelms
Assistant Examiner—Quoc Hoang
(74) Attorney, Agent, or Firm—Larson & Taylor PLC

(57) ABSTRACT

Method for deoxidizing and passivating, by sulphidation, a surface of a III–V compound semiconductor material undergo strong oxidation in the presence of oxygen, wherein the surface to be passivated is immersed in a dilute aqueous solution containing sulphide ions with a concentration of between about $10^{-1}$M and $10^{-7}$M.

4 Claims, No Drawings

METHOD FOR THE SULPHIDATION TREATMENT OF III-V COMPOUND SEMICONDUCTOR SURFACES

FIELD OF THE INVENTION

The present invention relates to improvements in the field of the fabrication of semiconductor devices made of a III–V compound semiconductor material undergo strong oxidation in the presence of oxygen, especially devices made of indium antimonide InSb (diodes used in the manufacture of infrared detectors), but also for example those made of gallium antimonide GaSb.

DESCRIPTION OF THE PRIOR ART

The process for fabricating semiconductor devices made of III–V compounds (that is to say compounds of elements from Groups III and V of the Periodic Table of Elements) exposes a work-hardened surface layer which it is necessary to remove. To remove this work-hardened layer, it is known, in the case of indium antimonide InSb, to subject the surface of the material to a chemical treatment by a mixture of various acids (nitric acid, hydrofluoric acid, acetic acid, lactic acid, bromic acid, etc.), and an insulator (for example $SiO_x$) is then deposited, by evaporation or by vacuum sputtering, onto the surface of the material in order to provide protection (passivation).

However, it has been found that the chemical treatment used to remove the work-hardened surface layer of the InSb semiconductor material results in a high degree of oxidation of the surface of the material with the formation of oxides of the constituent elements (indium oxide and antimony oxide).

It has also been found that deposition of the layer of insulator (for example $SiO_x$) on the surface thus treated of the semiconductor material leads to a chemical modification of the surface of the material with the formation of elemental chemical substances. Now, the presence of these compounds at the interface between the semiconductor material and the insulator layer has proved to be deleterious to obtaining semiconductor devices of good quality; in particular, the presence of elemental indium and/or antimony at the InSb/$SiO_x$ interface has an unfavourable effect on the performance of the diodes thus fabricated.

SUMMARY OF THE INVENTION

It therefore seems desirable to remove the oxides present on the surface after the chemical treatment to remove the work-hardened layer.

For this purpose, the invention provides a method for deoxidizing and passivating, by sulphidation, a surface of a III–V compound semiconductor material undergo strong oxidation in the presence of oxygen, which method is characterized, according to the invention, in that the surface to be passivated is immersed in a dilute aqueous solution containing sulphide ions with a concentration of between about $10^{-1}M$ and $10^{-7}M$. The best results are obtained for sulphide ion concentrations of between $10^{-2}M$ and $10^{-3}M$.

Admittedly, the sulphidation of semiconductor surfaces is already used in the electronics, and especially optoelectronics, industry. This treatment results in both electrical and chemical passivation of the semiconductor surface. Electrical passivation is manifested by a reduction in the density of surface states; chemical passivation allows the surface to be protected from oxidation from the action of the oxygen contained in air. This sulphidation treatment may be carried out chemically or electrochemically.

However, this known treatment employs sulphur precursors in the form of concentrated, or even pure solutions. The treatment of an InSb surface using $(NH_4)_2S_x$ as a pure solution (~3M) is described in the article "A $(NH_4)_2S_x$—treated InSb (001) surface studied by using X-ray photoelectron spectroscopy, low-energy electron diffraction, and inverse photoemission spectroscopy", by S. Ichikawa et al., in Journal of Vacuum Science and Technology A, Vacuum, Surfaces and Films, Vol. 17 No. 2, 1999, pages 421–424. This treatment causes a substantial modification to the chemical composition of the surface with, in particular, the growth of a thick film based on indium and sulphur. This surface structure may then be removed, but it does nevertheless represent a real technological problem. The invention reduces, or even eliminates, this drawback.

DETAILED DESCRIPTION OF THE INVENTION

A method for deoxidizing and passivating, by sulphidation, a surface of a III–V compound semiconductor material undergo strong oxidation in the presence of oxygen comprises, according to the invention, the step of immersing the surface to be passivated in a dilute aqueous solution containing sulphide ions with a concentration of between about $10^{-1}M$ and $10^{-7}M$. The best results are obtained for sulphide ion concentrations of between $10^{-2}M$ and $10^{-3}M$.

According to the invention, the sulphidation of a III–V semiconductor surface is carried out by immersing this semiconductor surface in the solution: the process is simple to employ.

Again according to the invention, the solution containing the sulphide ions which is used is a dilute, or even very dilute, solution compatible with the conditions of working in a clean room. Chemical bonds, which vary depending on the concentration of sulphide ions, may thus form between one or more of the elements of the III–V compound semiconductor material and the sulphur. Surface formation of indium oxide and antimony oxide occurs on the indium antimonide InSb whose work-hardened surface layer was removed by the chemical treatment indicated above. The sulphidation of this surface including the oxides results in an exchange between the oxygen of the oxides and the sulphur of the dilute treatment solution, thereby leading to substantial deoxidation of this surface. Controlling the sulphide ion concentration allows control:

i) of the type of sulphidation, with the formation of different chemical bonds between the sulphur and the III and V elements depending on the sulphide ion concentration;

ii) of the thickness of the sulphided surface layer, only in the case of antimonides, which appears to be critical for the desulphidation step which is then necessary in order to obtain high-performance InSb diodes.

In addition, this treatment allows the treated surface to be protected from oxidation by air, which oxidation is observed after a non-protecting treatment such as deoxidation by an acid solution.

The sulphidation solution dilution conditions recommended according to the invention allow a III–V semiconductor surface to be uniformly sulphided, while minimizing the amount of sulphur on this surface. This aspect appears to be paramount because of the fact that the presence of sulphur at the semiconductor material/insulating layer (for example $SiO_x$) interface is prejudicial to obtaining high performance in the final semiconductor device (for example InSb infrared diodes). Given the fact that desulphidation (for example by vacuum sublimation or by chemical etching in an aqueous acid solution) of the semiconductor surface is necessary before the final step of fabricating the semiconductor devices (junction formation), the presence of a smaller amount of sulphur on the surface seems to be a distinct advantage in terms of simplifying, controlling and speeding up the desulphidation process. In the case of InSb diodes, the maximum temperature envisaged for desulphidation is close to 300° C. taking into account the technology used. This temperature is perfectly well suited to the use of dilute sulphur solutions for which desulphidation is obtained above 230° C., but can no longer be envisaged in the case of more concentrated solutions in which desulphidation is obtained only above 400° C. for a pure $(NH_4)_2S_x$ solution.

In addition, the use of dilute, or even very dilute, solutions containing sulphide ions allows industrial implementation of this "clean room" treatment without the need for particular safety conditions, which would be the case if more concentrated solutions were employed.

As is already apparent from the above explanations, the method of the invention is particularly effective for treating antimony-based materials, and especially indium antimonide which is very useful in the fabrication of infrared-detecting diodes. A preferred and most particularly advantageous, although non-exclusive, application of the method of the invention is for the surface treatment of a semiconductor substrate made of indium antimonide InSb, for which compound the extent to which the surface composition can be controlled is greatest. This compound serves especially for the fabrication of diodes intended for infrared detectors which are particularly sensitive to oxidation phenomena, whereas oxidized InSb surfaces are virtually impossible to deoxidize by conventional chemical means.

However, the field of application of the method of the invention is not limited to this single semiconductor material. The method may be employed with other semiconductors made of compounds from Groups III and V which are highly oxidizable in the presence of oxygen and water vapour, such as gallium antimonide. The semiconductor surfaces treatable within the context of the invention are essentially those formed from III–V compounds, the elements of Groups III and V exhibiting high chemical reactivity to sulphur and also high stability of the chemical bond. Apart from InSb already mentioned, GaSb may also be named, while noting that InSb possesses greater reactivity to sulphur than GaSb.

The method of the invention may be implemented using various sulphur precursors.

According to a first example, a dilute aqueous solution of sodium sulphide $Na_2S$ is used, which results in the following reaction:

$$Na_2S + H_2O \Rightarrow HS^- + 2Na^+ + OH^-$$

In this case, $[OH^-]=[HS^-]$, that is to say the sulphide concentration is greater the higher the pH of the solution.

According to a second example, a commercial solution containing 20% diammonium sulphide $(NH_4)_2S$ is used:

$$(NH_4)_2S \Rightarrow HS^- + NH_3 + NH_4^+ ([HS^-]\#2.93M)$$

In this case $[NH_3]=[NH_4^+]$, which means that the diammonium sulphide solutions are buffer solutions having a pH of about 9.2.

In both cases, the sulphide ions contained in these solutions may oxidize to polysulphides $S_n^{2-}$ according to the reaction:

$$nHS^- + (n-1)/2 O_2 + (n-2)H^+ \Rightarrow S_n^{2-} + (n-1)H_2O.$$

Controlling the $S_n^{2-}$ concentration makes it possible, in conjunction with control of the treatment time, to control the thickness of the sulphided surface layer.

What is claimed is:

1. A method for deoxidizing and passivating, by sulphidation, a surface of a III–V compound semiconductor material undergo strong oxidation in the presence of oxygen, wherein the surface to be passivated is immersed in a dilute aqueous solution containing sulphide ions with a concentration of between about $10^{-2}$M and $10^{-3}$M.

2. The method according to claim 1, wherein the III–V compound semiconductor material is indium antimonide InSb, gallium antimonide GaSb and alloys of these compounds.

3. The method according to claim 1, wherein the dilute aqueous solution containing sulphide ions is a solution of sodium sulphide $Na_2S$.

4. The method according to claim 1, wherein the dilute aqueous solution containing sulphide ions is a commercial solution containing 20% diammonium sulphide $(NH_4)_2S$.

* * * * *